United States Patent [19]

Via et al.

[11] Patent Number: 4,814,730

[45] Date of Patent: Mar. 21, 1989

[54] QUADRATURE COMBINER

[75] Inventors: William R. Via, Baltimore; Thomas S. Dominick, Glen Burnie, both of Md.

[73] Assignee: Westinghouse Electric Corp., Pittsburgh, Pa.

[21] Appl. No.: 157,554

[22] Filed: Feb. 18, 1988

[51] Int. Cl.$^4$ ............................................. H03H 7/48
[52] U.S. Cl. ..................................... 333/119; 333/131
[58] Field of Search ..................... 333/4, 5, 109, 112, 333/117–119, 124, 131

[56] References Cited

U.S. PATENT DOCUMENTS

| 3,454,905 | 7/1969 | Winegard | 333/131 |
| 3,895,321 | 7/1975 | Seidel | 333/109 |
| 4,584,581 | 4/1986 | Teshirogi | 333/118 X |

OTHER PUBLICATIONS

Zverev, *Handbook of Filter Synthesis*, pp. 548–550, 524 & 525.

Primary Examiner—Paul Gensler
Attorney, Agent, or Firm—W. G. Sutcliff

[57] ABSTRACT

An improved, high frequency, high or low power, broadband quadrature combiner having a significant reduction in weight, and improved electrical performance such as, decreased insertion loss, improved phase linearity, reduced Intermodulation Distortion (IMD) and improved VSWR, as well as improved simplified tuning opportunities. A reduction in the number of transformers used in the prior art quadrature combiner design facilitates weight reduction and independent tuning of a zero and ninety degree phase network. Specific design improvements to the prior art quadrature combiner include: elimination of the input hybrid, scaling of the phase networks to twice its prior art impedance and optimization of values over the frequency range, and the substitution of an output hybrid utilizing a single hybrid transformer in series with an impedance matching transformer.

17 Claims, 4 Drawing Sheets

QUADRATURE COMBINER

BACKGROUND OF THE INVENTION

1. Field of the Invention

The present invention is directed to an improved, high frequency, high or low power, broadband, quadrature combiner having reduced weight, improved electrical performance and simplified tuning capabilities for use in an advanced development high frequency power amplifier.

2. Description of the Prior Art

The prior art quadrature combiner 10, as shown in FIG. 1, performed satisfactorily, but was complex and inherently heavy due to the eight (8) transformers 30, 35, 40, 45, 50, 55, 70, and 75 in its design. Further, the combiner 10 was difficult to tune because the negative ninety degree phase network 80 and the zero degree phase network 85 had to be decoupled and individually tuned.

Also, shown in FIG. 1, are the input signal phase relationships for each transformer and the number of transformers for each function. A first input voltage signal 15 shown as V1, and a second input voltage 20 shown as V2, are provided from two distinct amplifiers. Signals 15 and 20 are equal in amplitude and in phase quadrature. In FIG. 1 they are shown entering the input hybrid 25 which comprises hybrid transformers 30 and 35. Signals labeled 16 and 21 are shown as VR1 and VR2, respectively, and are the vector resultant of input signals 15 and 20. As a result of passing through transformers 30 and 35, VR1 is 45 degrees phase shifted from input voltage 15, (V1) and VR2 is negatively phase shifted 45 degrees from input voltage 20, (V2). Also, the characteristic impedance is decreased by one-half from 50Ω to 25Ω by hybrid transformers 30 and 35.

The function, therefore, of the input hybrid 25, is to combine signals 15 and 20, and then split the combination into two equal, single-ended output signals, 16 and 21, driving the two pairs of paralleled impedance matching transformers 40/45 and 50/55. Two transformers, 40/45 and 50/55, in parallel, are required for each of the designated matching transformers 60' and 60" in order to achieve the proper characteristic impedance of the transformer windings. Transformers 40/45 and 50/55 also convert the single ended input signals 16/21 into balanced output signals on lines 41/42 and 51/52 which are then applied to the phase networks 80/85. The function of the phase networks 80 and 85 is to shift the phase of the two input signals, 16 and 21, 90 degrees relative to each other and maintain this 90 degrees phase relationship consistently over the frequency range of at least 2 to 30 MHz close to a four octave range. The signals 90 and 95 coming out of the phase networks 80 and 85 thus have the same phase and amplitude and can be combined in the output hybrid 65, which consists of two transformers, 70 and 75. Differences in the phase and amplitude between signals VR1 and VR2 are dissipated as heat in the "dummy" load resistor 71 having a value of 50Ω.

Therefore, this prior art quadrature combiner 10 as shown in FIG. 1 requires eight (8) transformers, 30, 35, 40, 45, 50, 55, 70, and 75 and two phase networks, 80 and 85. This large number of transformers required in the prior art quadrature combiner 10 resulted in difficult tuning problems. Each of the individual transformers required capacitive tuning at the input and output to compensate for series inductive winding reactance. Capacitors were adjusted so that a 3 pole lowpass filter structure was formed with a bandwidth greater than 30 MHz. In general, the large number of transformers and the tuning required led to a degradation in the quadrature combiner's overall electrical performance.

Another serious problem with the prior art combiner 10 as shown in FIG. 1, is that the phase networks 80 and 85 were integrated in the unit 10 in such a way that they could not be individually tuned. The input hybrid 25 connects each of the phase networks 80 and 85 to both sources. Therefore, the networks 80 and 85 are isolated by only 3 dB. Connections in the prior art quadrature combiner 10 must then be broken and terminated in order to isolate the two phase networks 80 and 85 for tuning. Further, the two phase networks 80 and 85 cannot be directly compared against each other for phase quadrature. To meet system requirements, the phase networks 80 and 85 must be tuned to within plus or minus 2 degrees over the frequency band, 2-30 MHz. To achieve this specification requirements, the networks must be tuned externally and then fine-tuned in the unit 10 using a trial and error process. This results in time-consuming retuning and ineffective operation of the quadrature combiner.

The problem to be solved then is the development of an improved quadrature combiner operable for use in ultra-linear, high frequency, communications transmitters. The power amplifiers use feed forward cancellation to reduce intermodulation distortion. These improved quadrature combiners must be operable to cancel most orders of harmonics generated by the amplifiers, thus achieving the required amplifier linearity, and be further operable for use in signal isolation. In the high frequency transmitter, the quadrature combiner must perform in the output line to absorb power reflected from the antenna back into the transmitter. Power not absorbed and re-reflected towards the antenna disturbs the amplifier distortion cancellation loops and corrupts the amplifier linearity.

SUMMARY OF THE INVENTION

This application intends to illustrate an improved, high frequency, low or high power, broadband quadrature combiner, where this combiner may be used in ultra-linear, high frequency, communications transmitters. A first and a second input port receives signals from two distinct amplifiers. Both of these signals, 15 and 20, have a characteristic impedance of 50Ω. A first hybrid transformer then receives the first of these two input signals and converts this first single-ended voltage signal to a first balanced input signal. A second hybrid transformer receives the second of the two input signals and converts that second single-ended voltage signal into a second balanced input signal. A ninety degree phase shift network receives the first balanced input signal from the first hybrid transformer while a zero degree phase network receives the second balanced input signal from the second hybrid transformer. Both the ninety degree phase network and the zero degree phase network are comprised of a multiplicity of predetermined inductances and capacitances, all operable to maintain between the two signals a consistent ninety degree phase shift. Further, in the event that the two signals issuing from the ninety degree and the zero degree phase networks are of differing phase or amplitude, a load resistor is available to dissipate as heat any difference in phase or amplitude between the two signals. A third hybrid transformer combines the two signals. These two signals have at this point a characteristic impedance of 25Ω. A final impedance transformer receives the combined third hybrid output signal and increases the characteristic impedance from 25Ω to 50Ω.

BRIEF DESCRIPTION OF THE DRAWINGS

For a better understanding of the invention, reference may be had of the preferred embodiment exemplary of the invention shown in the accompanying drawings, in which.

DESCRIPTION OF THE PREFERRED EMBODIMENT

Figure 1:
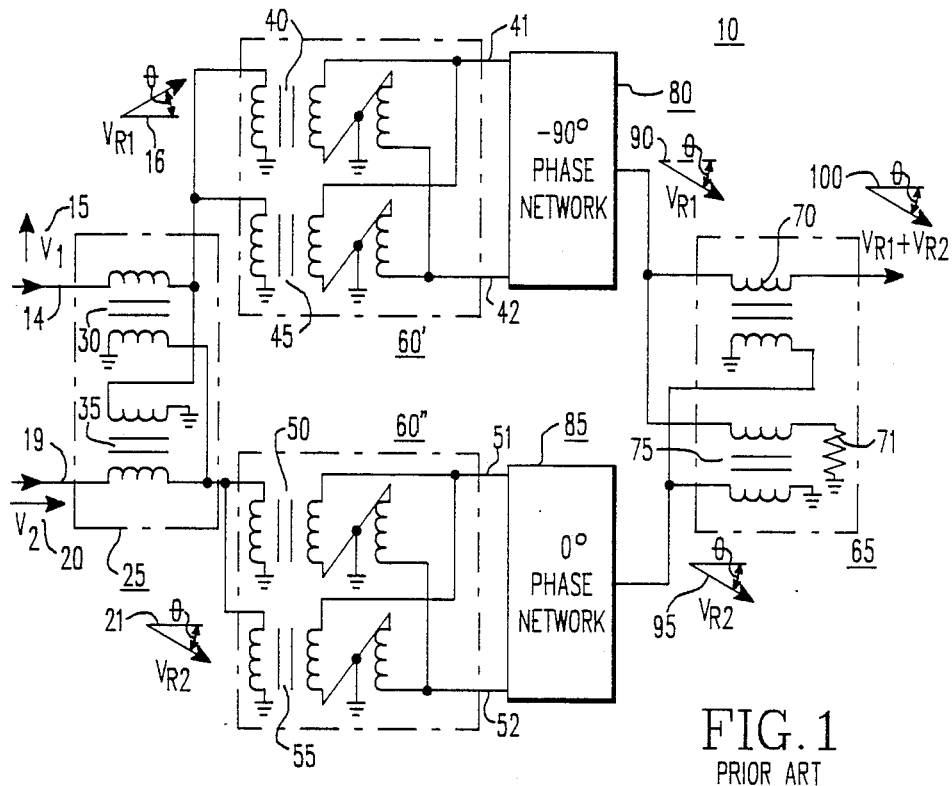
FIG. 1 is a circuit diagram of the prior art quadrature combiner.

FIG. 1, a circuit diagram, discloses an example in the prior art of a quadrature combiner 10. Input voltage signals V1, (15), and V2, (20) enter the input hybrid, 25 via input ports 14 and 19. The input hybrid, 25 comprises two transformers, 30 and 35. Further, input signals 15 and 20 have a source impedance of 50Ω. The voltage output VR1 and VR2 are vector combinations of input signals V1 and V2 after V1 and V2 exit the hybrid transformers 30 and 35. Signals VR1 and VR2 are consequently the same magnitude and are in phase quadrature.

Voltage output VR1, (16) enters the pair of matching transformers 60', which is comprised of paralleled transformers 40, 45. Voltage output VR2, (21) enters the pair of matching transformers 60", which is also comprised of paralleled transformers, here 50 and 55.

Two transformers in parallel are required for each of the matching transformers in order to achieve the proper winding characteristic impedance. The function of the phase networks 80 and 85 is to shift and maintain the phase relationship of the two input signals VR1, (16), and VR2, (21) ninety degrees relative to each other over the 2–30 MHz bandwidth. The signals VR1, (90) and VR2, (95) emitted out of phase networks, 80 and 85 thus have the same phase and amplitude and can be combined into the output hybrid 65 comprising two hybrid interconnected transformers 70 and 75. If signals 90 and 95 are not of equal amplitude and phase, any amount of amplitude or phase difference between them is dumped into the "dummy" load resistor 71 which has a value of 50Ω. The final output signal, 100 shown in FIG. 1 exiting from the output hybrid 65, is the sum of the amplitudes of signals VR1 and VR2 as they pass through and are combined in the interconnected hybrid transformers 70 and 75.

Figure 2:
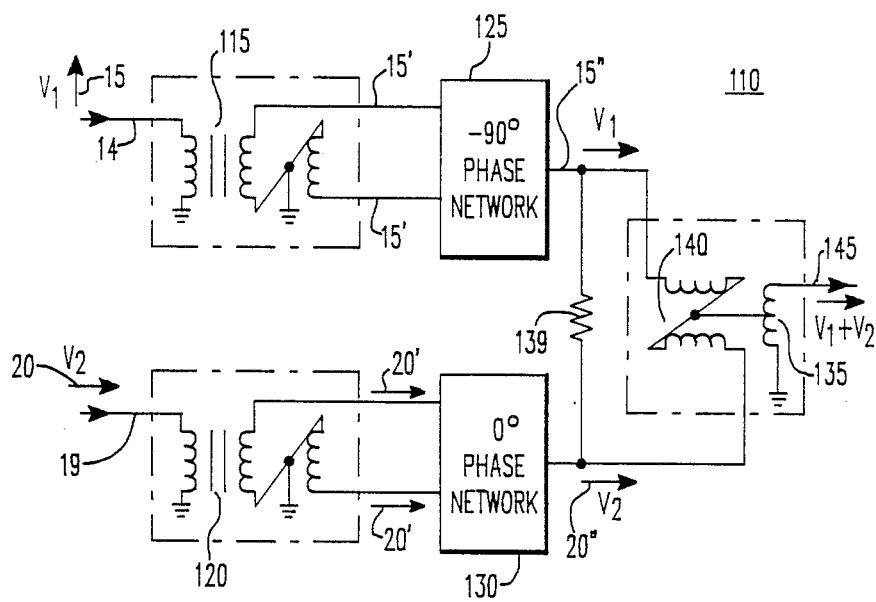
FIG. 2 is a circuit diagram of the preferred embodiment, an improved quadrature combiner.

The improved quadrature combiner 110 of this application as seen in FIG. 2 requires only four (4) transformers, 115, 120, 140, and 135. This reduction in the overall number of transformers results in a lightweight quadrature combiner 110 also having improved electrical performance, and improved tuning opportunities.

The improved quadrature combiner 110 as shown in FIG. 2 comprises three major improvements over the previous prior art quadrature combiner 10 as shown in FIG. 1. First, the input hybrid 25 as shown in the prior art quadrature combiner 10 of FIG. 1 is unnecessary. The original purpose of the input hybrid 25 was to connect the phase networks 80 and 85 to both voltage sources so that the driving impedances of both signals to both networks would be the same. However, this is unnecessary because the networks 80 and 85 can be adjusted to compensate for impedance variation. This modification eliminates two transformers 30 and 35 for the input hybrid 25. The second improvement comprises the scaling and element value optimization of the phase networks 80 and 85 of FIG. 1 from an impedance of 25Ω to 50Ω. The impedance matching transformers 40, 45, 50, and 55 are then replaced as single 50Ω transformers 115 and 120. This design change again eliminates two transformers. Finally, the third design improvement over the prior art occurs in the type of output hybrid 65 used in FIG. 1. The output hybrid 65 used in the prior art quadrature combiner 10 comprised a dual transformer hybrid 65. The improved quadrature combiner 110 as shown in FIG. 2 also required two transformers 140 and 135, but uses a single transformer hybrid 140 with one impedance matching transformer 135. The advantage of this modification is that the isolation between the two input ports is greater and typically 40 dB of signal isolation or more can be realized.

The improved quadrature combiner 110, as shown in FIG. 2, first comprises two input ports 14, and 19 operable to receive distinct signals 15 and 20. Both of these signals 15 and 20 have a characteristic impedance of 50Ω. These two signals, 15 and 20, enter into the first transformer hybrid 115 and the second transformer hybrid 120, respectively. Hybrid transformers 115 and 120 serve to convert the entering single-ended signals 15 and 20 into balanced output signals, 15' and 20'. These balanced signals, 15' and 20' then enter into the ninety degree phase network, 125 and the zero degree phase network 130, respectively. These two phase networks 125 and 130 maintain a consistent ninety degree phase separation between the balanced input signals 15' and 20'. The two phase consistent signals, 15" and 20" exit the ninety degree and zero degree phase networks into the third hybrid transformer, 140 which serves to combine the two single-ended signals into a combined third hybrid transformer 140 output signal. A 100Ω load resistor 139, serves to dissipate as heat, any discrepancy in amplitude or phase between the two signals 15" and 20". This third hybrid transformer, 140 output signal has a combined impedance characteristic of 25Ω. To function effectively in the 2–30 MHz band of the transmitter, this impedance characteristic of the third hybrid transformer, 140 must be doubled. A final impedance transformer, 135 is operable to receive the combined signal from the third hybrid transformer 140 and further operable to increase its characteristic impedance from 25Ω to 50Ω. The combined output signal 145 from the improved quadrature combiner 110 is now operable to be utilized in a transmitter functioning in the 2–30 MHz band. This unique design facilitates the individual tuning of the ninety degree 125 and zero degree 130 phase networks. Further, the overall reduction in the total number of transformers results in decreased weight for the improved quadrature combiner 110.

Figure 5A:
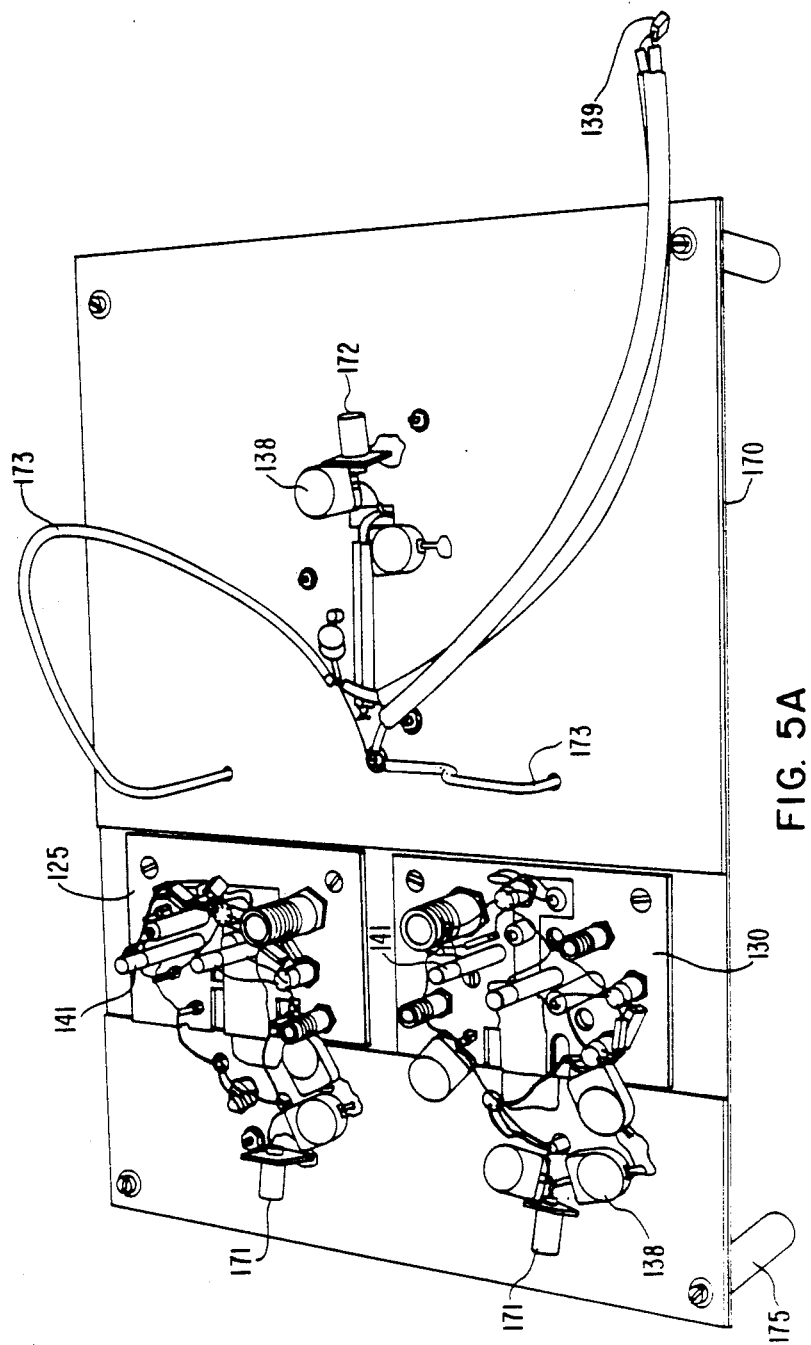
FIG. 5a is a plan view of the top surface of a bread board of the preferred embodiment, an improved quadrature combiner.
Figure 5B:
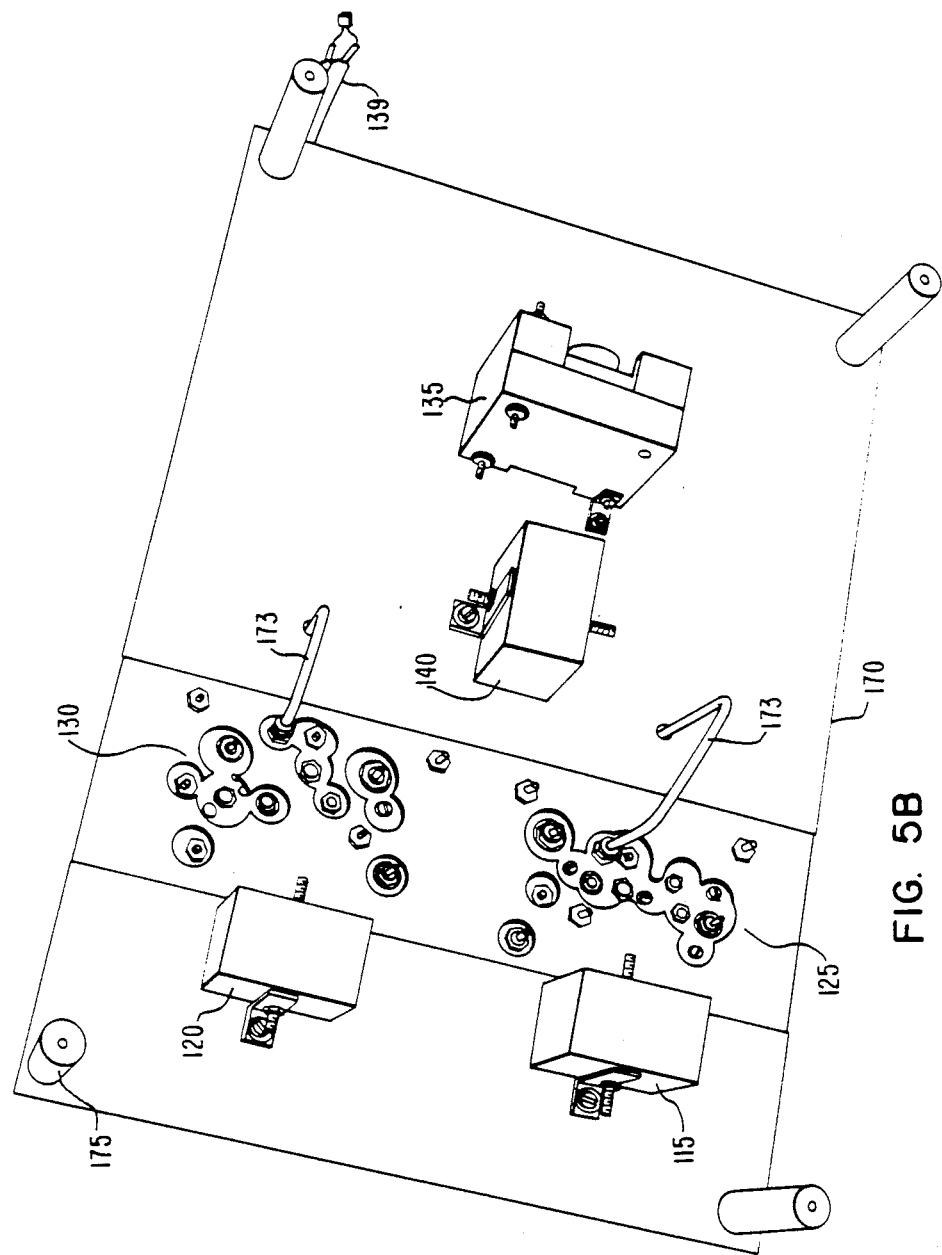
FIG. 5b is a plan view of the bottom surface of a breadboard of the preferred embodiment, an improved quadrature combiner.

A comparison of the important electrical parameters for the prior art quadrature combiner 10 and the improved combiner 110 of this application is given by Table 1. The results of Table 1 are the result of actual testing performed on a functioning model of the improved quadrature combiner 110 as shown in FIGS. 5A and 5B.

TABLE 1

|  | Prior Art Quadrature Combiner | Improved Quadrature Combiner |
| --- | --- | --- |
| Insertion Loss | −0.55 dB | −0.30 dB |
| Quad Phase Balance | +/−2° | +/−1 |
| Input and Output VSWRs | 1.1:1 | 1.05:1 |
| Worst Case *IMD | −95 dBc | −109 dBc |
| Phase Linearity | +/−2° | +/−1° |
| Input Isolation | 30 dB | 40 dB |

*Worst case IMD measured was 3rd order at 2.6 MHz with two tones of F = 2 + 2.3 MHz at 1 watt/tone.

Also, because the improved quadrature combiner 110 as shown in FIG. 2 has a signal isolation of 40 dB or more, the phase networks are independent and can be easily adjusted using a standard network analyzer.

Figure 3:
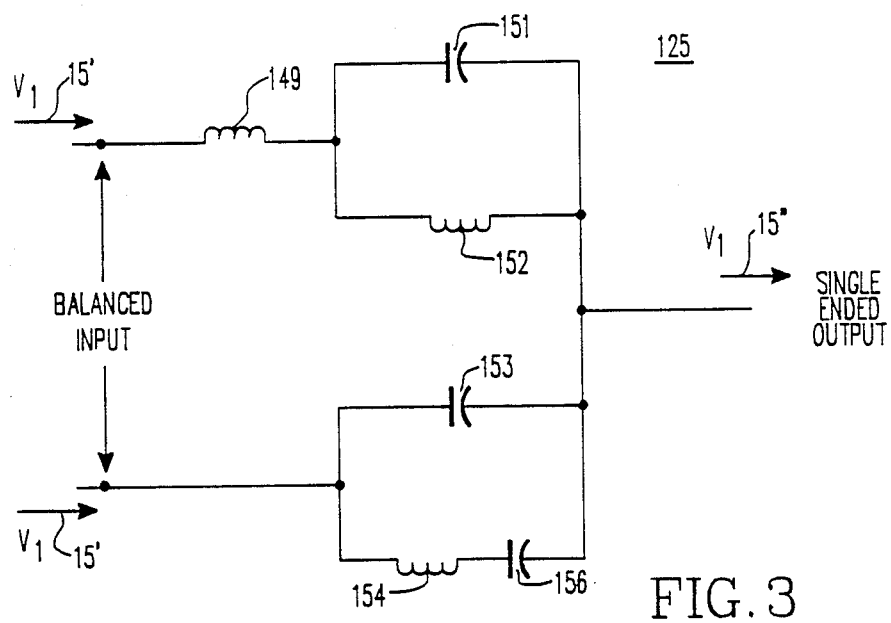
FIG. 3 is a circuit diagram of one element of the preferred embodiment, specifically the ninety degree phase network.

FIG. 3 is a circuit diagram of the ninety degree phase network 125, of the improved quadrature combiner 110 as shown functionally in FIG. 2. The input voltage V1, 15 comes from the hybrid transformer T1, 115, as balanced input voltage 15'. Voltage 15' splits into the upper and lower parallel circuits of the ninety degree phase network 125. First signal 15' passes through the upper portion of the circuit, through a fixed inductance 149. In the model tested of the improved quadrature combiner 110, this inductor has a specific value of 0.524 micro henries. In series with inductance 149 is parallel combination capacitor 151, having a value of 276 picofarads, and inductor 152 having an inductance of 26.3 micro henries. The lower portion of the parallel circuit of the ninety degrees phase network 125 comprises, in parallel, capacitor 153 having a value of 38 picofarads, inductor 154 having a value of 3.07 micro henries, and capacitor 156 having a value of 2524 picofarads all determined as a result of the specification of the overall circuit in the 2-30 MHz band. Output voltage signal 15'' exits from the ninety degree phase network 125 as a single-ended output signal. This circuit for the ninety degree phase network 125 is unique and maximizes optimum circuit element characteristics.

Figure 4:
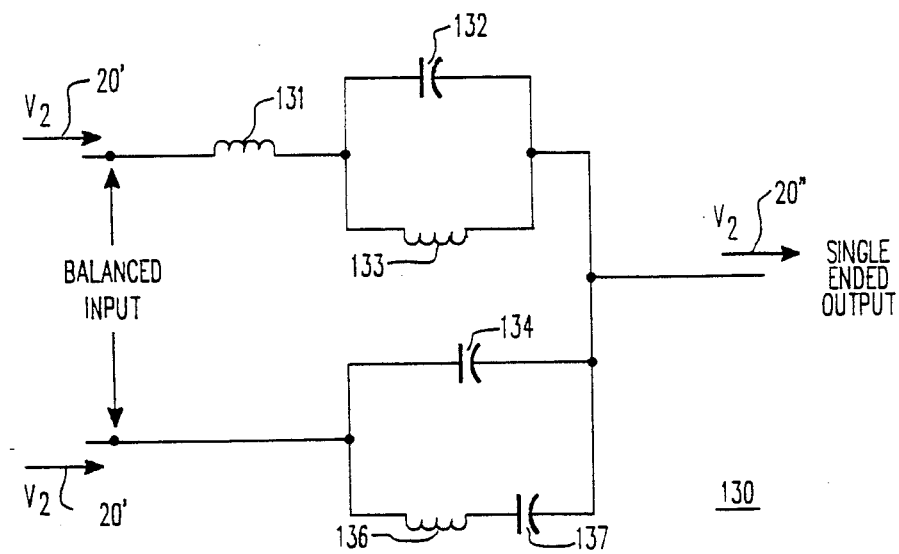
FIG. 4 is a circuit diagram of one element of the preferred embodiment, specifically the zero degree phase network.

FIG. 4 is a circuit diagram of the zero degree phase network 130. Input voltage 20 enters the phase network as balanced input voltage 20' from the hybrid transformer 120. Both the upper and lower portions of this circuit comprise a multiplicity of capacitances and inductances in series and parallel. The upper portion of the circuit 130 comprises a first inductor 131 of 0.210 micro henries. Inductor 131 is in series with a parallel combination of a capacitance, 132 of 115 picofarads and an inductor, 133 of a value of 8.4 micro henries. The lower circuit paralleled portion, of the zero degree phase network 130, comprises three elements: capacitor 134 with a value of 17 picofarads, in parallel with the series combination of inductor 136 of a value of 1.26 micro henries, and capacitor 137 having a value of 710 picofarads. All capacitances and inductances for zero degree phase network 130 are optimum for the improved quadrature combiner 110 operational in the 2-30 MHz band. output voltage 20'' exits the zero degree phase network 130 into the upper leg of the hybrid transformer 140 as a single-ended output signal. If signal 15'' and signal 20'' are not of equal magnitude and phase, all portions of their difference will be "dumped" into the 100Ω dissipation resistor 139.

FIG. 5A is a top surface plan view of the working model of the improved quadrature combiner 110. Support plate 170 has mounted upon it four (4) support feet 175 to provide ample volume about the exposed transformers and phase lines. Two separate input connectors 171 are operable to receive the distinct input voltage signals 15 and 20. A multiplicity of trimmer capacitors 138 and tubular tuning capacitor 141 are exposed upon the surface of the support plate 170 to match the input signals 15 and 20 before they enter the ninety degree phase network 125 and the zero degree phase network 130. Coaxial phase lines 173 coil upon the surface of the support plate. An additional trimmer capacitor 138 is connected to the output connector 172, which is operable to discharge the combined phase matched output signal, 145. A "dummy" load resistor 139 of a 100Ω resistance is operable to dissipate as heat any discrepancy of amplitude between signals 15'' and 20''.

FIG. 5B is a bottom surface plan view of the working model of the improved quadrature combiner 110. Support plate 170 now viewed from the underside of the combiner has mounted upon it four (4). support feet 175. Transformers 115, 120, 140, and 135 can be clearly seen mounted upon the surface of the support plate 170. Phase compensation lines 173 are shown exiting the surface of the support plate 170 from the zero degree 130 and ninety degree 125 phase networks. "Dummy" load resistor 139 can be seen partially obstructed by the support plate 170.

Numerous drawings shall be interpreted as illustrative and not in a limiting sense. Variations may be made in the above-described combination and different embodiments of this invention may be made without departing from the spirit thereof. Therefore, it is intended that all matter contained in the foregoing description and in the accompanying drawings shall be interpreted as illustrative and not in a limiting sense.

We claim:

1. An improved high frequency, low or high power broadband quadrature combiner, operable for use in ultra-linear, high frequency, communications transmitters, comprising:

a first input port means, said first input port means operable to receive from a first amplifier, said first amplifier external to said improved quadrature combiner, a first, single-ended voltage signal, said first single-ended voltage signal having a characteristic impedance of 50Ω;

a second input port means, said second input port means operable to receive from a second amplifier, said second amplifier external to said improved quadrature combiner, a second, single-ended voltage signal, said second single-ended voltage signal having a characteristic impedance of 50Ω;

a first hybrid transformer, said first hybrid transformer operable to receive said first single-ended voltage signal from said first input port means, and said first hybrid transformer further operable to convert said first single-ended voltage signal to a first balanced input signal, said first balanced input signal having a characteristic impedance of 50Ω;

a second hybrid transformer, said second hybrid transformer operable to receive said second single-ended voltage signal from said second input port means, and said second hybrid transformer further operable to convert said second single-ended voltage signal to a second balanced input signal, said second balanced input signal having a characteristic impedance of 50Ω;

a ninety degree phase network, said ninety degree phase network operable to receive said first balanced input signal from said first hybrid transformer, and said ninety degree phase network further operable to convert said first balanced input signal into a ninety degree consistent single-ended ninety degree phase network output signal, said single-ended ninety degree phase network output signal having a characteristic impedance of 25Ω;

a zero degree phase network, said zero degree phase network operable to receive said second balanced input signal from said second hybrid transformer, and said zero degree phase network further operable to convert said second balanced input signal into a zero degree single-ended zero degree phase network output signal having a characteristic impedance of 25Ω, said zero degree single-ended zero degree phase network output signal operable in phase with said single-ended ninety degree phase network output signal;

a load resistor interconnected between said ninety degree phase network and said zero degree phase network, said load resistor operable to receive the difference in amplitude and phase between said single-ended ninety degree phase network output signal having a characteristic impedance of 25Ω and said single-ended zero degree phase network output signal having a characteristic impedance of 25Ω, said load resistor further operable to dissipate as heat said difference in phase and amplitude between said single-ended ninety degree phase network output signal and said single-ended zero degree phase network output signal;

a third hybrid transformer, said third hybrid transformer operable to receive said single-ended ninety degree phase network output signal and said single-ended zero degree phase network output signal, said third hybrid transformer operable to combine said single-ended ninety degree phase network output signal having a characteristic impedance of 25Ω, and said zero degree phase network output signal having a characteristic impedance of 25Ω into a combined third hybrid transformer output signal having a characteristic impedance of 25Ω; and an impedance transformer, said impedance transformer operable to receive said combined third hybrid of 25Ω, and further operable to increase said characteristic transformer output signal having a characteristic impedance of 25Ω to 50Ω, said combined third hybrid transformer output signal operable for use in ultra-linear, high frequency, communications transmitters.

2. An improved high frequency, low or high power broadband quadrature combiner, as in claim 1, wherein said load resistor has a fixed value of 100Ω.

3. An improved high frequency, low or high power broadband quadrature combiner, as in claim 1, wherein said ninety degree phase network comprises:

a ninety degree phase network first input port, said ninety degree phase network first input port operable to receive a first one-half of said first balanced input signal from said first hybrid transformer;

a ninety degree phase network second input port, said ninety degree phase network second input port operable to receive a second one-half of said first balanced input signal from said first hybrid transformer;

a ninety degree phase network first inductor, said ninety degree phase network first inductor having a predetermined inductance and operable to receive from said ninety degree first input port, said one-half of said first balanced input signal from said first hybrid transformer;

a ninety degree phase network first capacitor and a ninety degree phase network second inductor, said ninety degree phase network first capacitor and said ninety degree phase network second inductor both having predetermined values of capacitance and inductance, respectively further said ninety degree phase network first capacitor and said second inductor interconnected in parallel with each other, both said ninety degree phase network first capacitor and said ninety degree phase network second inductor electrically interconnected in series to said ninety degree phase network first inductor;

a ninety degree phase network second capacitor, said ninety degree phase network second capacitor having a predetermined capacitance, said second capacitor operable to receive said second one half of said first balanced input signal from said first hybrid transformer;

a ninety degree phase network third inductor said third inductor having a predetermined inductance, electrically interconnected in series with a ninety degree phase network third capacitor, said ninety degree phase network third capacitor having a predetermined capacitance, said third inductor in series with said third capacitor further electrically interconnected in parallel with said second capacitor; and, a ninety degree phase network output port, said ninety degree phase network output port operable to receive and emit a ninety degree phase network single ended output signal from said ninety degree phase network said output port, wherein said single ended output signal is the result of said first balanced input signal entering said first and said second ninety degree phase network input ports, said first one half of said first balanced input signal passing through aid first inductor electrically interconnected in series with said first capacitor and said second inductor electrically interconnected in parallel, and said second one half of said first balanced input signal entering into said second capacitor, said second capacitor electrically interconnecting in parallel with said third inductor and said third capacitor, said first inductor, said first capacitor and said second inductor electrically interconnected to said ninety degree phase network output port and said second capacitor, said third inductor and said third capacitor all electrically interconnected to said output port.

4. A ninety degree phase network as in claim 3, wherein said ninety degree phase network first inductor has a predetermined inductance of 0.524 micro Henries.

5. A ninety degree phase network as in claim 3, wherein said ninety degree phase network first capacitor has a predetermined capacitance of 276 pico Farad.

6. A ninety degree phase network as in claim 3, wherein said ninety degree phase network second inductor has a predetermined inductance of 26.3 micro Henries.

7. A ninety degree phase network as in claim 3, wherein said ninety degree phase network second capacitor has a predetermined capacitance of 38 pico Farad.

8. A ninety degree phase network as in claim 3, wherein said ninety degree phase network third inductance has a predetermined inductance of 3.07 micro Henries.

9. A ninety degree phase network as in claim 3, wherein said ninety degree phase network third capacitance has a predetermined capacitance of 2524 pico Farads.

10. An improved high frequency, low or high power broadband quadrature combiner, as in claim 1, wherein said zero degree phase network comprises:
a zero degree phase network first input port, said zero degree phase network input port operable to receive a first one half of said second balanced input signal from said second hybrid transformer;
a zero degree phase network second input port, said zero degree phase network second input port operable to receive a second one half of said second balanced input signal from said second hybrid transformer;
a zero degree phase network first inductor, said zero degree phase network first inductor having a predetermined inductance and operable to receive from said zero degree phase network first input port, said first one half of said second balanced input signal from said second hybrid transformer;
a zero degree phase network first capacitor and a zero degree phase network second inductor, said zero degree phase network first capacitor and said zero degree phase network second inductor each having predetermined values of capacitance and inductance, respectively, further said zero degree phase network first capacitor and said zero degree phase network second inductor are electrically interconnected in parallel one to the other, and said parallel interconnected zero degree phase network first capacitor and said zero degree phase network second inductor are further interconnected in series with said zero degree phase network first inductor;
a zero degree phase network second capacitor electrically interconnected in parallel with a zero degree phase network third inductor and a zero degree phase network third capacitor, said zero degree phase network third inductor and said zero degree phase network third capacitor electrically interconnected one to the other in series, further said parallel electrical interconnection of said zero degree phase network second capacitor, said zero degree phase network third inductor and said zero degree phase network third capacitor all operable to receive from said zero degree phase network second input port said second one half of said second balanced input signal from said second hybrid transformer;
a zero degree phase network output port, said zero degree phase network output port operable to receive and emit a zero degree phase network single-ended output signal from said zero degree phase network output port, wherein said single ended output signal is the result of said second balanced input signal entering said first and said second zero degree phase network input ports, said first one-half of said second balanced input signal passing through said zero degree phase network first inductor, said first inductor in series with said first capacitor in parallel with said second inductor, wherein said single ended output signal is further the result of said second balanced input signal entering said second input port as said second one half of said second balanced input signal, said second half of said input signal passing through said second capacitor in parallel with said series interconnected said third inductor and said third capacitor.

11. A zero degree phase network as in claim 10, wherein said zero degree phase network first inductor has a value of 0.210 micro Henries.

12. A zero degree phase network as in claim 10, wherein said zero degree phase network first capacitor has a value of 115 pico Farads.

13. A zero degree phase network as in claim 10, wherein said zero degree phase network second inductor has a value of 8.4 micro Henries.

14. A zero degree phase network as in claim 10, wherein said zero degree phase network second capacitor has a value of 17 pico Farads.

15. A zero degree phase network as in claim 10, wherein said zero degree phase network third inductor has a value of 1.26 micro Henries.

16. A zero degree phase network as in claim 10, wherein said zero degree phase network third capacitor has a value of 710 pico Farads.

17. An improved high frequency, low or high power broadband quadrature combiner, operable for use in ultra-linear, high frequency, communications transmitters, and further operable to combine a first distinct, single-ended input and a second distinct, single-ended input signal, said first and said second distinct single-ended input signals being in phase quadrature and said first and said second distinct input signals having a predetermined characteristic impedance, into a single, combined, output signal, comprising:
a first hybrid transformer, said first hybrid transformer operable to receive said first distinct, single-ended, input signal and said first hybrid transformer further operable to convert said first distinct, single-ended, input signal into a first distinct, balanced input signal;
a second hybrid transformer, said second hybrid transformer operable to receive said second distinct, single-ended, input signal and said second hybrid transformer further operable to convert said second distinct, single-ended, input signal into a second distinct, balanced input signal;
a ninety degree phase network, said ninety degree phase network operable to receive from said first hybrid transformer said first distinct, balanced input signal and said ninety degree phase network further operable to convert said first distinct, balanced input signal into a first distinct single-ended, output signal and further operable to maintain a ninety degree phase shift relationship between said first distinct, balanced input signal, and said second distinct, balanced input signal;

a zero degree phase network, said zero degree phase network operable to receive from said second hybrid transformer said second distinct, balanced input signal and said zero degree phase network further operable to convert said second distinct, balanced input signal into a second distinct single-ended, output signal and further operable to maintain a ninety degree phase shift relationship between said first distinct, balanced output signal, and said second distinct, balanced output signal;

a load resistor, said load resistor operable to receive said first and said second distinct, single-ended, output signals from said ninety degree and said zero degree phase networks, respectively and said load resistor further operable to dissipate as heat any discrepancy in amplitude or phase between said first and said second distinct, single-ended, output signals;

a third hybrid transformer, said third hybrid transformer operable to receive from said ninety degree phase network and said zero degree phase network said first and said second distinct, single-ended, output signals and said third hybrid transformer operable to combine said first and said second distinct, single-ended, output signals into a single, combined, third, distinct, single-ended, phase coherent output signal having a predetermined characteristic impedance one-half the value of said first and said second distinct, single-ended, output signals; and, an impedance transformer, said impedance transformer operable to receive from said third hybrid transformer, said single, combined, third distinct, single-ended, output signal having a predetermined characteristic impedance one-half the value of said first and said second distinct, single-ended output signals, and said impedance transformer further operable to double said predetermined characteristic impedance of said single combined, distinct, third single-ended, output signal and said impedance transformer being further operable to transmit as an output, said single combined, third distinct, single-ended, output signal having the same characteristic impedance as said first and said second distinct, single-ended, input signals.

* * * * *